US005475330A

United States Patent [19]

Watanabe et al.

[11] Patent Number: 5,475,330
[45] Date of Patent: Dec. 12, 1995

[54] INTEGRATED CIRCUIT WITH VOLTAGE SETTING CIRCUIT

[75] Inventors: Toshio Watanabe, Nara; Junji Tanaka, Sakurai, both of Japan

[73] Assignee: Sharp Kabushiki Kaisha, Osaka, Japan

[21] Appl. No.: 264,770

[22] Filed: Jun. 23, 1994

Related U.S. Application Data

[63] Continuation of Ser. No. 890,165, May 29, 1992, abandoned.

[30] Foreign Application Priority Data

Sep. 4, 1991 [JP] Japan ................................. 3-254801

[51] Int. Cl.⁶ ................................................ G01R 31/28
[52] U.S. Cl. .......................... 327/408; 327/404; 326/16; 324/158.1
[58] Field of Search ................................ 307/362, 465.1, 307/470, 471; 324/158.1; 371/14, 22.1; 302/475, 443, 448, 272.3

[56] References Cited

U.S. PATENT DOCUMENTS 4,424,460  1/1984  Best ........................................ 307/471
4,985,641  1/1991  Nagayama et al. ..................... 307/362

FOREIGN PATENT DOCUMENTS 0099033   6/1983   Japan ..................................... 307/571
61-208315 9/1986   Japan .
63-37268  2/1988   Japan .
2278171   11/1990  Japan ................................. 324/158 T Primary Examiner—Timothy P. Callahan
Assistant Examiner—Dinh To Le

[57] ABSTRACT

An integrated circuit may have a mode to be switched over if a predetermined signal voltage is input through a mode switching terminal when the predetermined voltage is applied to one or more signal input terminals. The integrated circuit is provided with a voltage setting circuit disposed between the signal input terminal and the logic circuit, for setting the signal input terminal to receive any voltage in the range of a ground voltage to a power source voltage in response to a signal voltage input through the mode switching terminal.

1 Claim, 6 Drawing Sheets

INTEGRATED CIRCUIT WITH VOLTAGE SETTING CIRCUIT

This application is a continuation of application Ser. No. 07/890,165 filed on May 29, 1992, now abandoned.

BACKGROUND OF THE INVENTION

1. Field of the Invention

The present invention relates to an integrated circuit having a function for enabling a mode of a circuit to be switched over if a predetermined signal is input to a mode switching signal input terminal in a condition where a predetermined voltage is applied to one or more signal input terminals.

2. Prior Art and Related Reference

In a conventional integrated circuit, (1) a semiconductor device is described in, for example, Japanese Patent Application Laid-Open No. 1990-278171 published on Nov. 14, 1990 in Japan. A test terminal, a test circuit, and a resistive element are provided for the semiconductor device disclosed in Japanese Patent Application Laid-Open No. 1990-278171. The semiconductor device has the test circuit serving as the resistive element between an input terminal and a power source. Further, the semiconductor device is fundamentally constructed as will be later described and as shown in FIG. 1. With reference to FIG. 1, reference numerals 11, 13, and 14 correspond to the input terminal, an input stage transistor, and the test terminal, respectively.

The test terminal is pulled up by a pull-up resistive element 15. Reference numeral 12 refers to the test circuit which includes a single transistor having a large ON resistance.

The test circuit 12 is turned OFF if the test terminal 14 is opened or a high voltage is applied to the test terminal 14. On the other hand, the test circuit 12 is turned ON if a low voltage is applied to the test terminal 14. When the test circuit 12 is held ON, the test circuit 12 serves as the resistive element because the test circuit 12 includes the transistor having the large ON resistance. Therefore, the resistive element is disposed between the input terminal 11 and the positive power source to connect with each other so that the input terminal 11 is pulled up. Thus far, a description has been made for a case where the input terminal 11 is pulled up by the test circuit 12. However, with the test circuit 22 as will be described later and as shown in FIG. 2, the input terminal 21 may be pulled down. In this case, when the high voltage is applied to the test terminal 24, the input terminal 21 can be pulled down.

(2) On the other hand, the conventional semiconductor device constructed as shown in FIG. 3 is also well known in the art. Reference numeral 30 in FIG. 3 refers to an essential component circuit in an integrated circuit β. In this figure, terminals of an integrated circuit 30 are partially illustrated. A test mode setting terminal A serves as a terminal to input a voltage signal required for turning ON and OFF a test mode setting logic circuit 32. Signal terminals B1, B2, B3 serve as terminals to input and output a signal, and serve as terminals to set and input a voltage level which is required during the test mode.

In the integrated circuit 30, when a ground voltage (GND) is applied to the test mode setting terminal A, the test mode setting logic circuit 32 is switched over to the test mode. Accordingly, it is possible to test in the condition that the signal terminal B1 is set to a power source voltage Vcc, that the signal voltage B2 is set to the ground voltage, and that the signal terminal B3 is set to any reference voltage $V_E$. Additionally, the integrated circuit 30 leaves the test mode when the test mode setting terminal A is set to the power source voltage Vcc or is opened.

However, in the semiconductor device as disclosed in Japanese Patent Application Laid-Open No. 1990-278171, the integrated circuit can exit the test mode only when the input terminal is opened. There is a further disadvantage in the semiconductor device as disclosed in Japanese Patent Application Laid-Open No. 1990-278171. Namely, the semiconductor device cannot include two or more of each circuit to set the terminal voltage to the power source voltage Vcc, to the ground voltage (GND) or to an optional voltage, respectively. Furthermore, to activate a plurality of integrated circuits β as shown in FIG. 3 in the test mode simultaneously, the respective integrated circuits β should be arranged as shown in FIG. 4. That is, it is necessary to connect the signal input terminals B1 to B3 with each other as well as the test mode setting terminals A. Thus, increasing the number of the integrated circuits β causes a complicated wiring, and requires vast amount of labor and time. In addition, some terminals cannot be possibly wired due to a restricted dimension of a package or a limited space in circumference.

If the integrated circuit β is aged in the test mode, fundamental circuits become aged while some circuit blocks are not aged. For example, it is impossible to age the logic circuit 31 disposed between the signal input terminals B1 to B3 and the test mode setting terminal A. The logic circuit 31 can be activated in any mode other than the test mode. As a result, there is another drawback that the whole circuit may not provide a high reliability.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

SUMMARY OF THE INVENTION

It is an object of the present invention to overcome the above-mentioned drawbacks of the conventional integrated circuit.

That is, it is a principal object of the invention to provide an integrated circuit having a reduced amount of wiring which is required for enabling a mode of the integrated circuit to be switched over.

It is another object of the invention to provide an enabling integrated circuit to set a signal input terminal to receive any one of a power source voltage Vcc, a ground voltage (GND) and an optional voltage.

It is another object of the invention to provide an integrated circuit which can be used when the signal input terminal has a pull-up transistor or a pull-down transistor.

These objects are achieved as will be discussed in the following paragraphs.

According to an embodiment of the present invention, an integrated circuit has a function to enable a mode of a circuit to be switched over if a predetermined signal voltage is input through a mode switching terminal in a condition where the predetermined voltage is applied to one or more signal input terminals for use at a predetermined voltage. The integrated circuit comprises a voltage setting circuit arranged to be connected between the signal input terminal and a logic circuit. The voltage setting circuit may set the signal input terminal to receive an optional voltage in the range of a ground voltage (GND) to a power source voltage in response to a signal voltage which is input through the mode switching terminal.

As noted hereinbefore, the integrated circuit includes the voltage setting circuit arranged between the signal input terminal and the logic circuit. The voltage setting circuit may set the signal input terminal to receive any voltage in the range of the ground voltage to the power source voltage Vcc in response to the signal voltage which is input through the mode switching terminal. Therefore, it is not necessary to connect the respective signal input terminals of the respective integrated circuits with each other even if the number of terminals for the integrated circuit is increased.

Consequently, the integrated circuit of the present invention may considerably reduce the time for wiring operation, the time for an operation step, and the required space relative to the conventional integrated circuit.

DESCRIPTION OF THE PREFERRED EMBODIMENTS

A preferred embodiment of the present invention will be described hereinafter with reference to the drawings.

Figure 1:
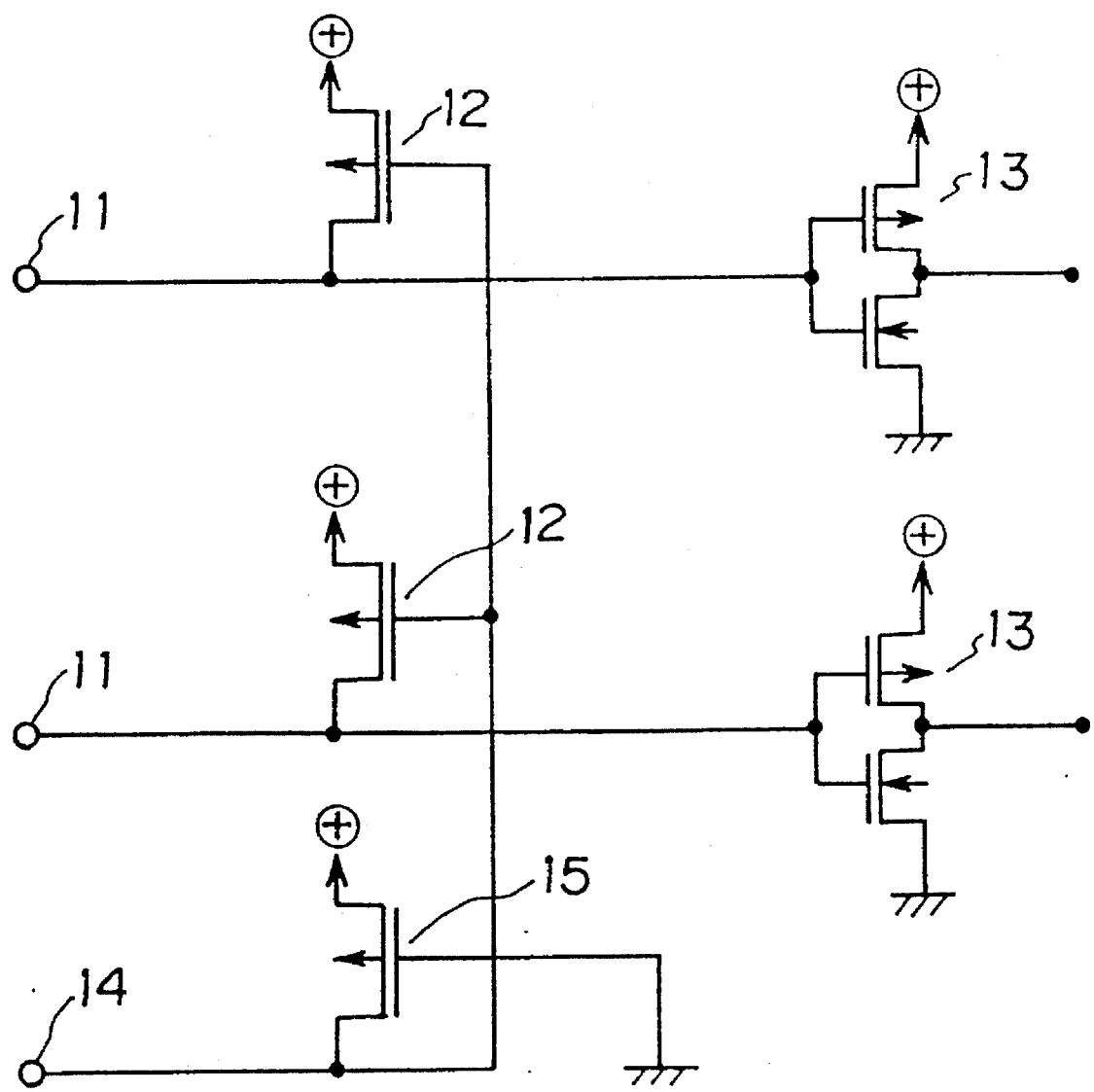
FIG. 1 is a circuit diagram showing a structure of a test circuit in a conventional semiconductor device.
Figure 2:
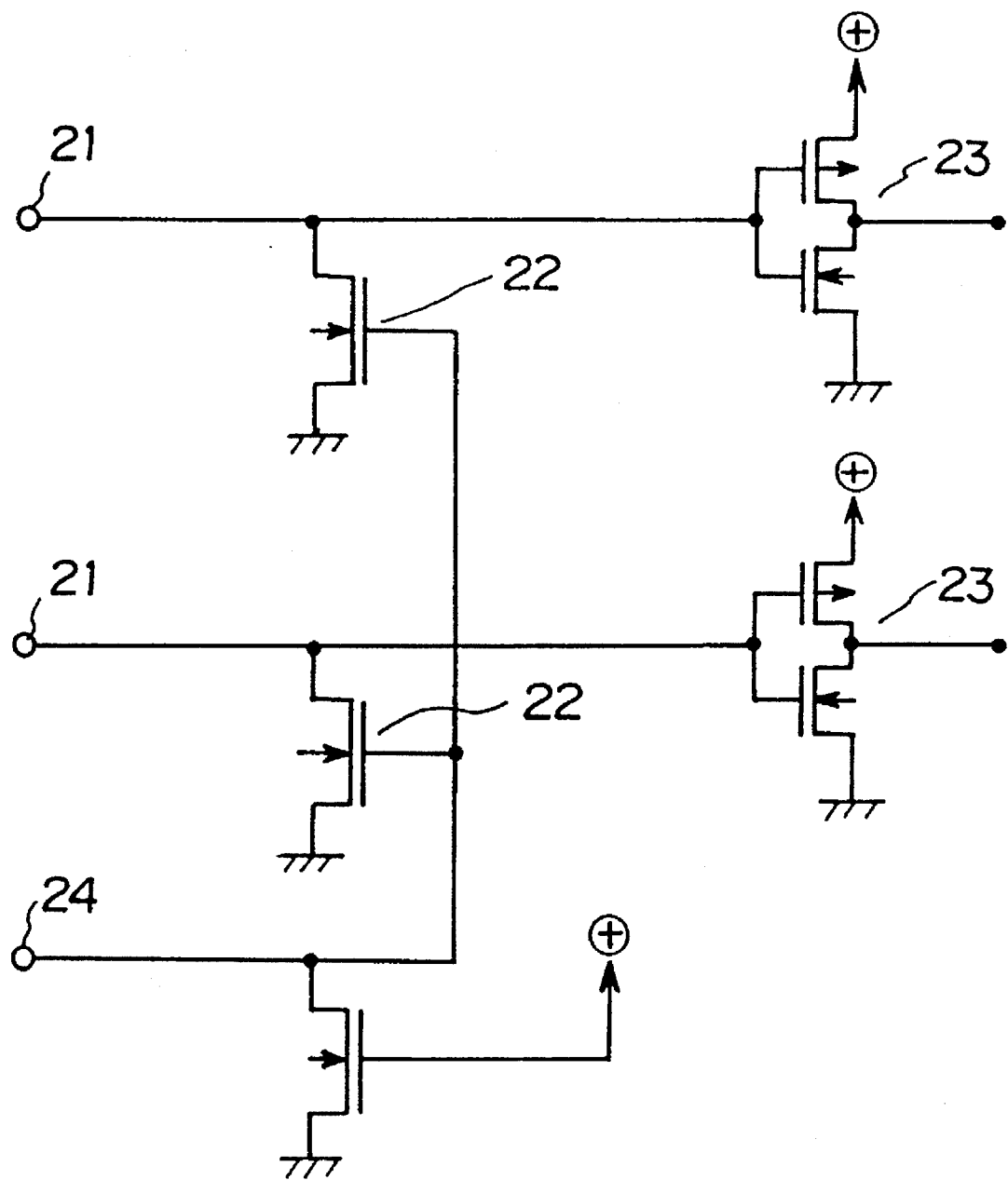
FIG. 2 is a circuit diagram showing the semiconductor device of FIG. 1 with the pull down test circuit.
Figure 3:
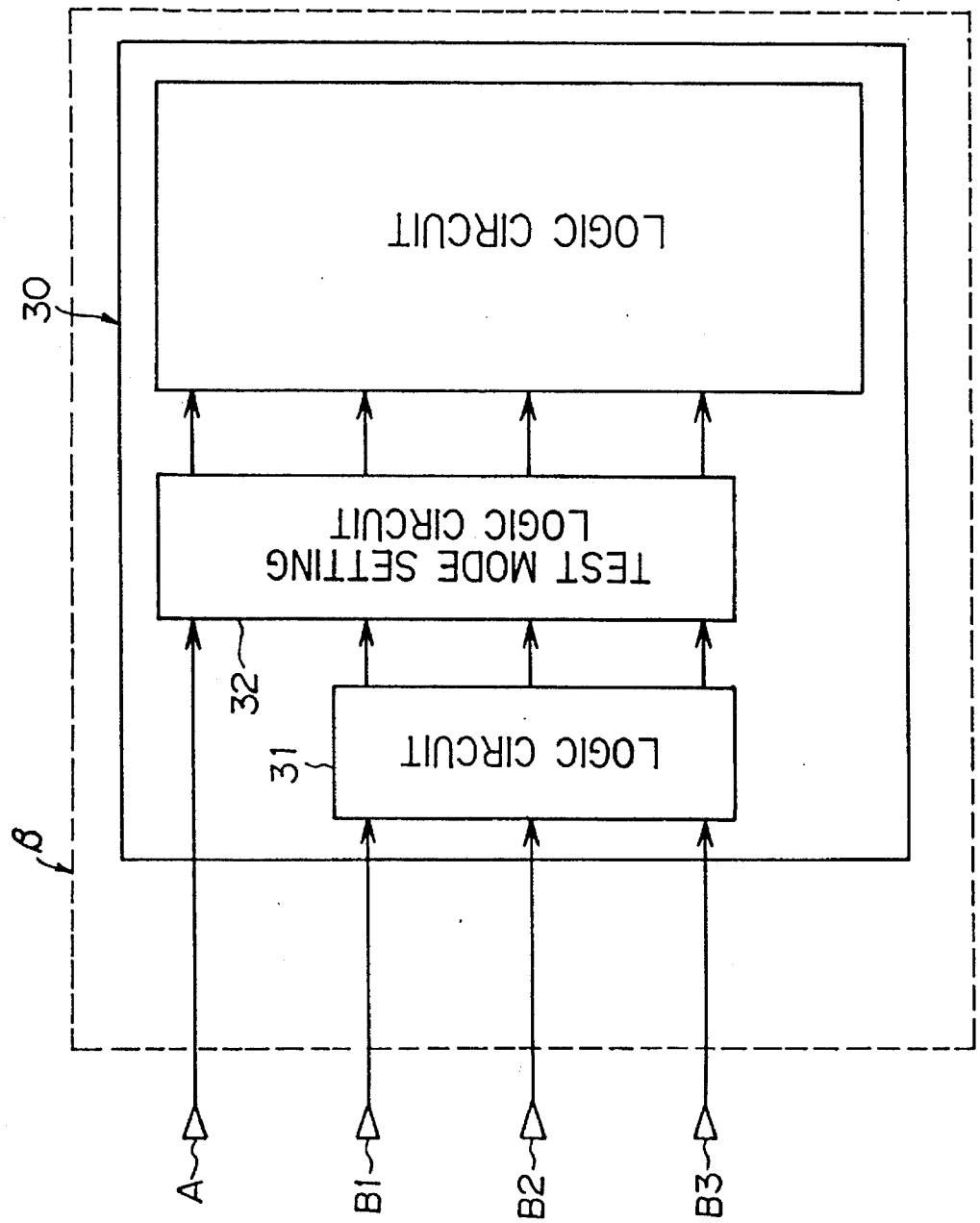
FIG. 3 is an essential block diagram showing a fundamental structure of a conventional integrated circuit.
Figure 4:
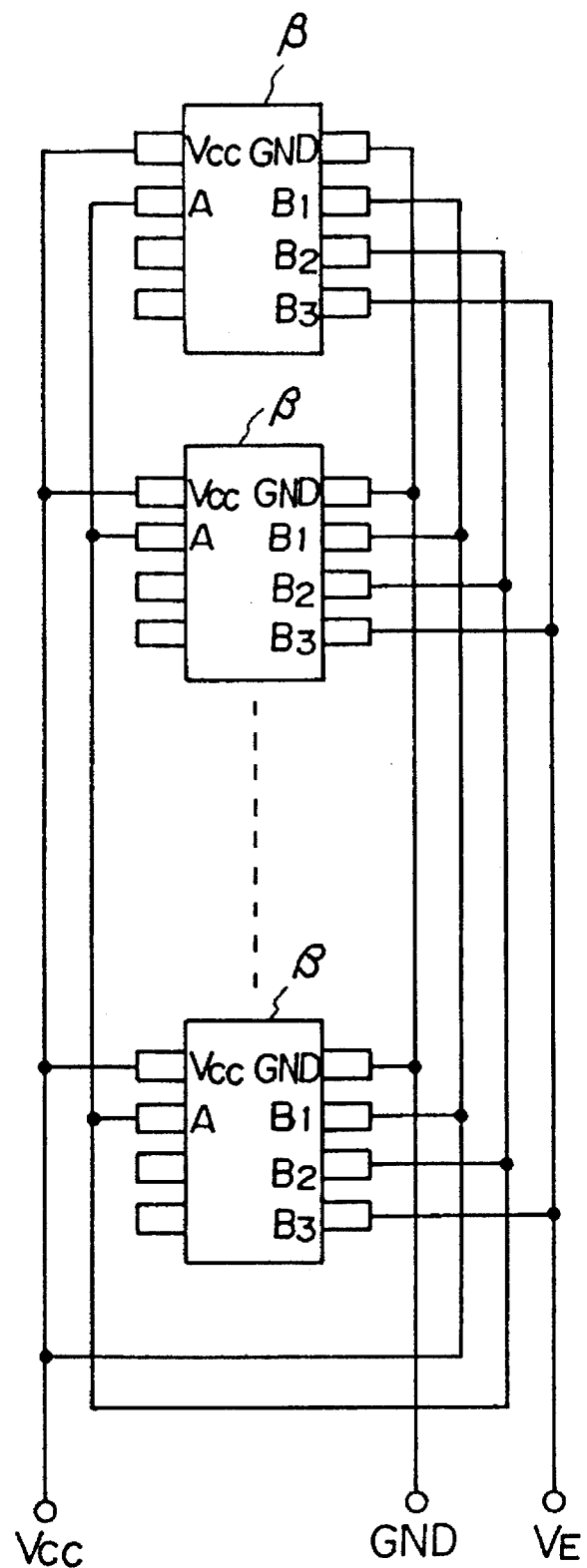
FIG. 4 is a wiring diagram showing the plurality of conventional integrated circuits in a case of activating in a test mode at the same time.
Figure 5:
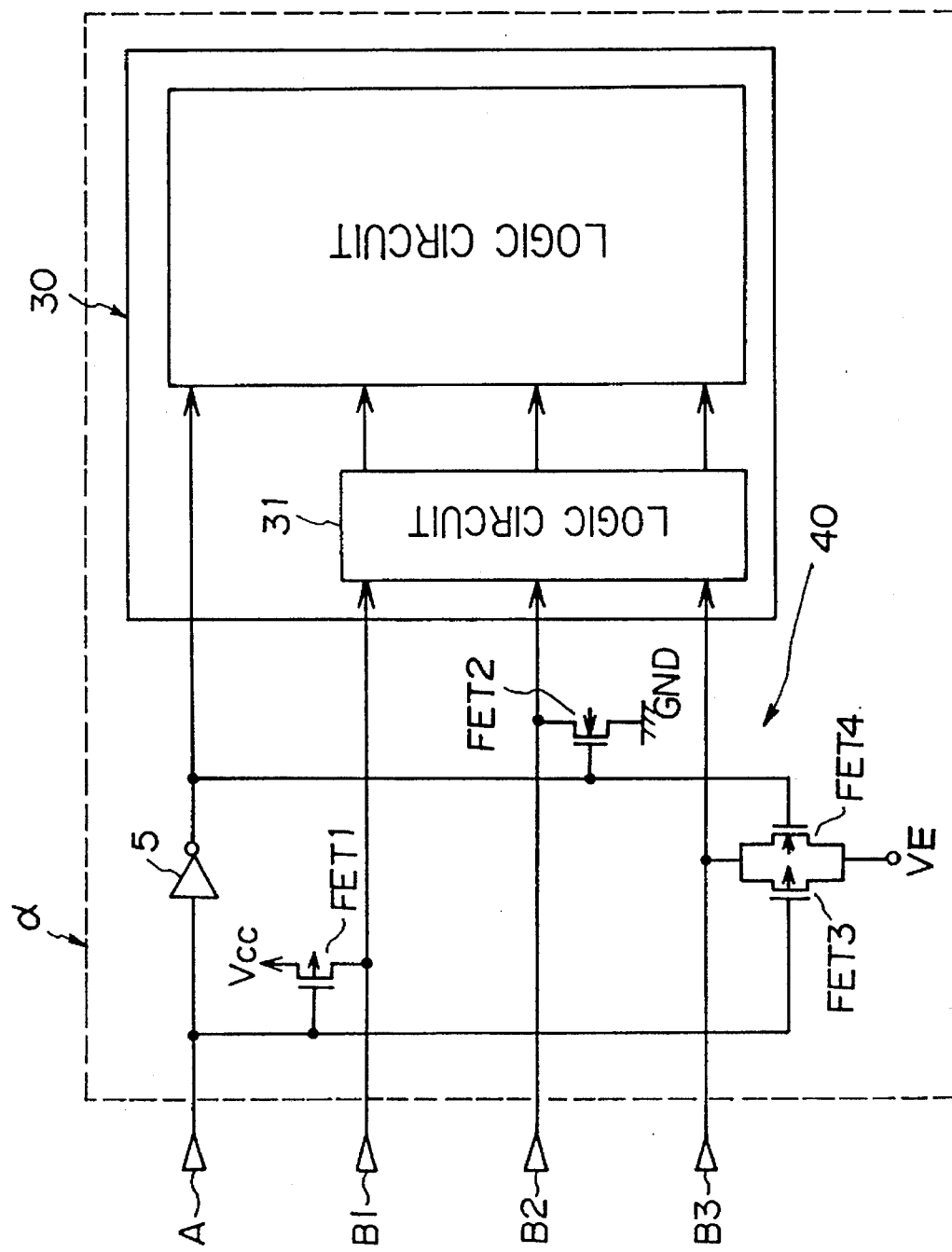
FIG. 5 is a circuit diagram showing an internal structure of an integrated circuit for an embodiment of the present invention.

FIG. 5 is a circuit diagram partially illustrating an internal structure of the integrated circuit for an embodiment of the present embodiment. The integrated circuit a of the invention has a function (a test mode) for automatically testing an operation of a circuit as in the case of the conventional integrated circuit as shown in FIG. 3. Further, when the integrated circuit a is switched over to the test mode, a signal input terminal and a mode setting terminal A are applied as in the case of the conventional integrated circuit.

Unlike the conventional circuit, the circuit of the present embodiment is provided with a voltage setting circuit 40, which is arranged between each terminal, i.e., the mode setting terminal A (corresponding to a mode switching input terminal), and the signal input terminals B1 to B3, and an integrated circuit 30 (corresponding to a logic circuit) to connect with each other. The voltage setting circuit 40 will be described hereinafter.

The integrated circuit of the present embodiment is provided with an inverter 5 arranged between the mode setting terminal A and an integrated circuit 30 to connect with each other. The mode setting terminal A is connected to each gate of p-channel FETs (Field Effect Transistors) 1, 3 as well as to an input terminal of the inverter 5.

On the other hand, an output terminal of the inverter 5 is connected to each gate of n-channel FETs 2, 4 as well as to an input terminal of a test mode setting logic circuit 31 (see FIG. 3) in the integrated circuit 30. A source of the n-channel FET 2 is grounded (GND) and a drain thereof is connected to the signal terminal B2. Further, the p-channel FET 3 and the n-channel FET 4 have a shared source, and are connected to the signal terminal B3. Each drain of the FETs 3, 4 is connected to a voltage generating circuit (not shown) for generating a reference voltage ($V_E$: $0 > V_E > Vcc$). In the case of a conventional circuit, the reference voltage ($V_E$) is externally supplied to the integrated circuit. However, in the circuit of the present embodiment, the circuit is supplied by the voltage generating circuit which is separately provided in the integrated circuit.

The construction of the voltage setting circuit 40 should be changed according to a voltage which should be applied to the signal input terminals B1 to B3 during the test mode. The circuit including the n-channel FET 2 may be used if the signal terminal is set to the voltage Vcc (corresponding to the power source) or if the circuit including the p-channel FET 1 is set to the ground (GND) voltage. In addition, the inverter 5 may be omitted in the case where all of the signal input terminals B1 to B3 are set to the power source voltage Vcc or the ground (GND) voltage.

A description will be given of an operation in the case that the integrated circuit having the construction as set forth above is switched over to the test mode.

When the test mode setting terminal A is set to the GND voltage, in other words, a signal voltage is input through the mode setting terminal A, a voltage Vcc (corresponding to the power source) is output from the inverter 5. Accordingly, the FETs 1, 2, 3, and 4 are turned ON, respectively. For, each gate voltage of the p-channel FETs 1 and 3 is set to the GND voltage while each gate voltage of the n-channel FETs 2 and 4 is set to the power source voltage Vcc. As a result, the signal input terminal B1 is set to the power source voltage Vcc, the signal input terminal B2 is set to the GND voltage. Hence, the reference voltage ($V_E$) is applied to the signal terminal B3 by the voltage generating circuit set forth hereinbefore. Also, in the present embodiment, an inverter (not shown) is separately provided in a stage preceding a circuit to restore an inverted signal since the mode setting logic circuit 32 can be naturally switched over to the test mode by the GND voltage.

If the mode setting terminal A is set to the power source voltage Vcc or is opened, the FETs 1, 2, 3, and 4 are respectively turned OFF to leave the mode. By leaving the mode, a signal can be input and output through the signal input terminals B1 to B3.

Figure 6:
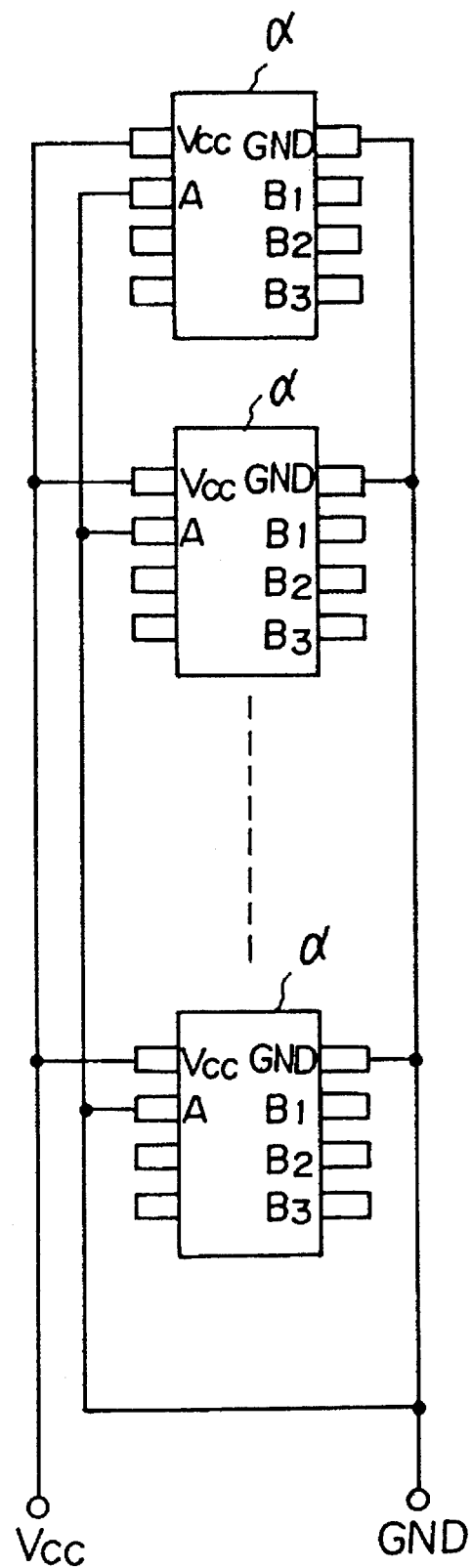
FIG. 6 is a wiring diagram showing the plurality of circuits of FIG. 5 in a case of activating in the test mode at the same time.

When the plurality of integrated circuits α set forth above are simultaneously operated in the test mode, the integrated circuits α are wired as shown in FIG. 6. Namely, a general wiring may be employed as long as the mode setting terminals A are communicated with each other and connected to a grounding wire.

Thus, unlike the conventional circuit, it is not necessary to connect the signal input terminals B1 to B3 with each other to operate the integrated circuit of the present embodiment in the test mode. As a result, it is possible to reduce an operation time required for wiring, to reduce the wiring operation, and to reduce a working space required for the operation even if the number of the integrated circuits α is increased.

Further, it is not necessary to connect the signal input terminals B1 and B2 with each other even if the reference voltage $V_E$ is obtained external to the signal terminal B1. As a result, the wiring operation can be facilitated in the circuit of the present embodiment relative to the conventional circuit. Particularly, it is possible to avoid such a case that the voltage level cannot be set for the signal input terminals B1 to B3 due to, for example, a limited space.

Moreover, unlike the conventional circuit, it is possible to age the logic circuit 31 as well as the signal terminals B1 to B3 when aged in the test mode. Therefore, a higher reliability can be improved in the whole circuit.

It must be noted that the integrated circuit of the present invention may have any kind of a circuit mode to be switched over, and the number of the signal input terminal required to set in the mode should not be limited.

Furthermore, the integrated circuit may be adapted to change the kind of circuit mode according to the voltage which is set for one or more signal input terminals. Additionally, the integrated circuit may include the signal input terminal without extending from a package thereof.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit comprising:

a mode switching terminal switching a mode of the integrated circuit when a predetermined mode signal is received;

at least one signal input terminal receiving at least one input signal;

a voltage setting circuit connected to said at least one signal input terminal and the input of a logic circuit for connecting said at least one signal input terminal and said logic circuit with each other, and connected to said mode switching terminal, setting said at least one signal input terminal to receive a voltage between a ground voltage and a power source voltage in response to the predetermined input signal received through said mode switching input terminal, said voltage setting circuit comprising:

an inverter connected to said mode switching input terminal;

first and third field effect transistors having each gate connected to said mode switching input terminal, having the drain terminal of said first field effect transistor connected to a first signal input terminal and the drain of said third field effect transistor connected to a third signal input terminal, and having the source of said first field effect transistor connected to a power source voltage and the source of said third field effect transistor connected to a reference voltage; and second and fourth field effect transistors having each gate connected to an output terminal of said inverter, having the drain terminal of said second field effect transistor connected to a second signal input terminal and the drain terminal of said fourth field effect transistor connected together with the drain terminal of said third field effect transistor to said third signal input terminal, and having the source of said second field effect transistor connected to said ground voltage and the source of said fourth field effect transistor terminal connected to said reference voltage.

* * * * *